(12) United States Patent
Smith et al.

(10) Patent No.: US 10,843,618 B2
(45) Date of Patent: Nov. 24, 2020

(54) CONFORMALITY MODULATION OF METAL OXIDE FILMS USING CHEMICAL INHIBITION

(71) Applicant: Lam Research Corporation, Fremont, CA (US)

(72) Inventors: David C. Smith, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/962,953

(22) Filed: Apr. 25, 2018

(65) Prior Publication Data
US 2019/0203354 A1 Jul. 4, 2019

Related U.S. Application Data

(60) Provisional application No. 62/611,541, filed on Dec. 28, 2017.

(51) Int. Cl.
*H01L 21/02* (2006.01)
*B60P 3/34* (2006.01)
(Continued)

(52) U.S. Cl.
CPC .............. *B60P 3/341* (2013.01); *B60J 7/1621* (2013.01); *B60J 7/1657* (2013.01);
(Continued)

(58) Field of Classification Search
CPC combination set(s) only.
See application file for complete search history.

(56) References Cited

U.S. PATENT DOCUMENTS

2007/0026540 A1 2/2007 Nooten et al.
2011/0159204 A1* 6/2011 Dickey .................. C23C 16/40
427/539
(Continued)

FOREIGN PATENT DOCUMENTS

JP 2014236096 12/2014
KR 20110092485 8/2011

OTHER PUBLICATIONS

"International Application Serial No. PCT US2018 065825, Written Opinion dated Apr. 9, 2019", 6 pgs.
(Continued)

*Primary Examiner* — Moin M Rahman
(74) *Attorney, Agent, or Firm* — Schwegman Lundberg & Woessner, P.A.

(57) ABSTRACT

Methods and systems for conformality modulation of metal oxide films in atomic layer deposition (ALD) are provided. Some example methods use chemical inhibition. An example system for performing such a method comprises a chamber; a source of precursor gas; a source of inhibiting precursor gas; one or more injectors having respective gas flow paths, each having an inlet connectable to the source of the precursor or the inhibiting precursor gas, and being adapted to deliver into the chamber, separately or in conjunction with another injector, precursor gas at a first gaseous flow rate in a first region of the plurality of regions to form a first film at a first deposition rate, and being adapted to deliver inhibiting precursor gas at a second gaseous flow rate in the same or a second region of the plurality of regions to inhibit growth of the first film.

8 Claims, 11 Drawing Sheets

(51) Int. Cl.
*B60J 7/16* (2006.01)
*C23C 16/455* (2006.01)
*C23C 16/52* (2006.01)

(52) U.S. Cl.
CPC .. *C23C 16/45534* (2013.01); *C23C 16/45548* (2013.01); *C23C 16/52* (2013.01); *H01L 21/0228* (2013.01); *B60Y 2200/14* (2013.01); *H01L 21/0217* (2013.01); *H01L 21/02164* (2013.01); *H01L 21/02178* (2013.01); *H01L 21/02181* (2013.01)

(56) References Cited

U.S. PATENT DOCUMENTS

| | | | |
|---|---|---|---|
| 2016/0145738 A1* | 5/2016 | Liu | H01L 21/76883 427/251 |
| 2016/0148839 A1* | 5/2016 | Abelson | H01L 21/76879 438/608 |
| 2016/0293398 A1 | 10/2016 | Danek et al. | |
| 2017/0032990 A1 | 2/2017 | Lin et al. | |
| 2017/0323782 A1* | 11/2017 | Suzuki | C23C 16/45536 |

OTHER PUBLICATIONS

"International Application Serial No. PCT US2018 065825, International Search Report dated Apr. 9, 2019", 3 pgs.

International Application Serial No. PCT/US2018/065825, International Preliminary Report on Patentability dated Jul. 9, 2020, 8 pgs.

* cited by examiner

CONFORMAL

CONFORMALITY MODULATION OF METAL OXIDE FILMS USING CHEMICAL INHIBITION

CLAIM OF PRIORITY

This application claims the benefit of priority, under 35 U.S.C. Section 119(e), to Smith U.S. Provisional Application No. 62/611,541, filed Dec. 28, 2017, entitled "CONFORMALITY MODULATION OF METAL OXIDE FILMS USING CHEMICAL INHIBITION," which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings, that form a part of this document: Copyright Lam Research Corporation, 2017-2018, All Rights Reserved.

FIELD

The present disclosure relates generally to selective atomic layer deposition in the fabrication of semiconductor devices and, more particularly, to conformality modulation of metal oxide films using chemical inhibition. In one example, improved film profile control is provided using selective inhibition.

BACKGROUND

Conventionally, atomic layer deposition (ALD) is a thin-film deposition technique based on the sequential use of a gas phase chemical process. ALD is considered a subclass of chemical vapor deposition. The majority of ALD reactions use two chemicals, typically called precursors. These precursors react with the surface of a material one at a time in a sequential, self-limiting, manner. Through the repeated exposure to separate precursors, a thin film is deposited.

ALD is a key process in the fabrication of semiconductor devices and wafers, and part of the set of tools available for the synthesis of nanomaterials. Profile control in metal oxide deposition can also be achieved with periodic etch back steps, but this introduces additional hardware and cost.

The present disclosure seeks to address at least these drawbacks. It should be noted that the information described in this section is provided to provide the skilled artisan some context for the following disclosed subject matter and should not be considered as admitted prior art.

SUMMARY

In one example embodiment, an ALD apparatus comprises a chamber; a source of precursor gas; a source of inhibiting precursor gas; one or more injectors having respective gas flow paths, each having an inlet connectable to the source of the precursor or the inhibiting precursor gas, and being adapted to deliver into the chamber, separately or in conjunction with another injector, precursor gas at a first gaseous flow rate in a first region of the plurality of regions to form a first film at a first deposition rate, and being adapted to deliver inhibiting precursor gas at a second gaseous flow rate in the same or a second region of the plurality of regions to inhibit growth of the first film.

In some examples, the one or more injectors is further adapted to deliver the inhibiting precursor gas into the chamber prior to admission of the precursor gas into the chamber. In some examples, the one or more injectors is further adapted to deliver the precursor gas into the chamber prior to admission of the inhibiting precursor gas into the chamber. In some examples, the one or more injectors is further adapted to deliver the inhibiting precursor gas into the chamber simultaneously with admission of the precursor gas into the chamber. In some examples, the one or more injectors is further adapted to deliver a second precursor gas at a third gaseous flow rate in one of the plurality of regions to form a second film at a second deposition rate. In some examples, the one or more injectors is further adapted to deliver the second precursor gas simultaneously with admission of the inhibiting precursor gas into the chamber. The inhibiting precursor gas may include one or more of a chelating agent, a diketone, a thiol, an alcohol, and a phosphine. In some examples, the one or more injectors is further adapted to deliver a low exposure of an inhibiting precursor gas at an exposure level <1% of the minimum exposure required to achieve saturation of the precursor gas on a flat surface.

DESCRIPTION OF THE DRAWINGS

Some embodiments are illustrated by way of example and not limitation in the views of the accompanying drawings.

DESCRIPTION

The description that follows includes systems, methods, techniques, instruction sequences, and computing machine program products that embody illustrative embodiments of the present invention. In the following description, for purposes of explanation, numerous specific details are set forth in order to provide a thorough understanding of example embodiments. It will be evident, however, to one skilled in the art that the present invention may be practiced without these specific details.

Atomic layer deposition (ALD) has emerged as an important technique for depositing thin films for a variety of applications. Semiconductor processing has been one of the main motivations for the recent development of ALD. The International Technology Roadmap for Semiconductors (ITRS) has included ALD for high dielectric constant gate oxides in the MOSFET structure and for copper diffusion barriers in backend interconnects. In addition, ALD has met challenging requirements in other areas including the deposition of high quality dielectrics to fabricate trench capacitors for DRAM. Miniaturization in the semiconductor industry has led to the requirement for atomic level control of thin film deposition. Miniaturization has produced very high aspect structures that need to be coated conformally. No other thin film technique can approach the conformality achieved by ALD on high aspect structures. The necessity for continuous and pinhole-free films in semiconductor devices has driven the advancement of ALD. Other applications with similar demanding requirements outside of the semiconductor industry are low electron leakage dielectrics for magnetic read/write heads and diffusion barrier coatings with low gas permeability.

As mentioned above, conventional ALD seeks to meet the needs for atomic layer control and conformal deposition using sequential, self-limiting surface reactions. Most ALD processes are based on binary reaction sequences where two surface reactions occur and deposit a binary compound film.

Figure 1A:
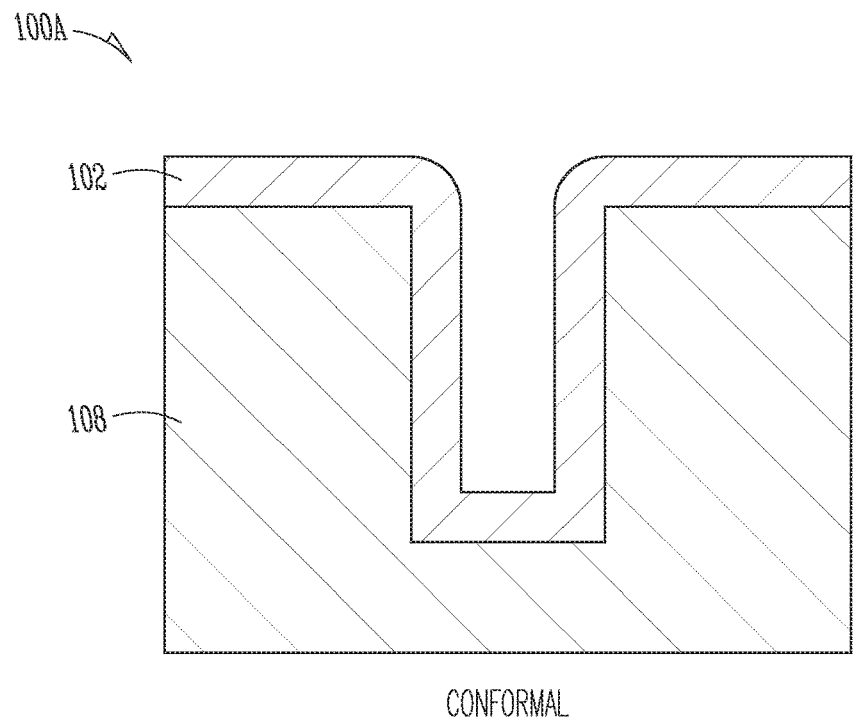
FIGS. 1A-1B are schematic sectional views of conformal structures, according to example embodiments.
Figure 1B:
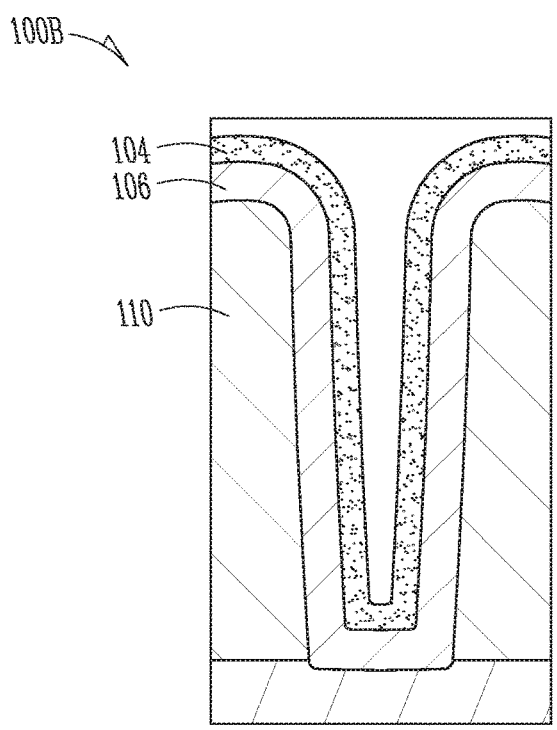
Figure 2B:
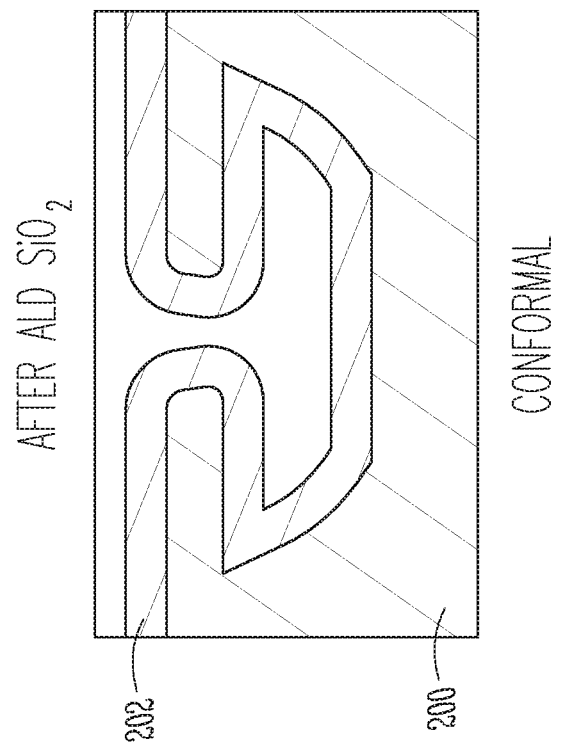
FIGS. 2A-2B include schematic sectional views of another conformal structure, according to an example embodiment.
Figure 2A:
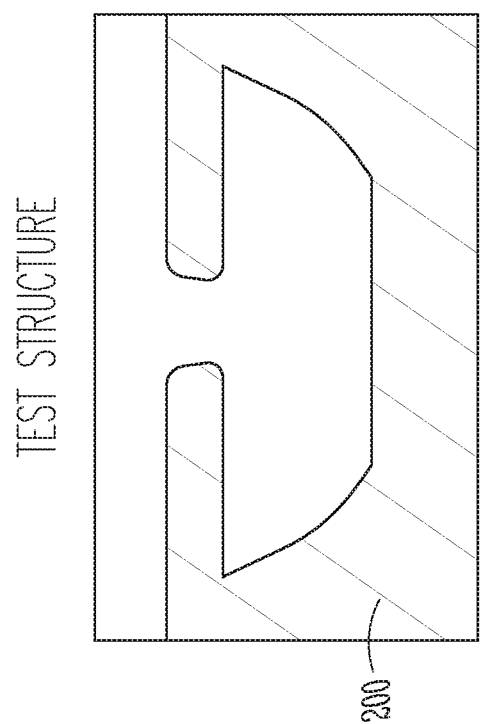

Current ALD of metal oxides generally results in films that are conformal (high exposure of both precursors) or sub-conformal (low exposure of both precursors). Sectional views of example conformal structures 100A and 100B are shown in FIGS. 1A-1B. In each view, the overlying layers 102 (FIG. 1A), and 104-106 (FIG. 1B) created by ALD "conform" to the shape of the respective underlying structures 108 and 110. Further views of a conformal structure are provided in FIG. 2. In the view on the left, a test structure 200 is shown. After ALD with silicon dioxide ($SiO_2$), a conformal layer 202 has been formed on the structure 200 as shown in the view on the right.

Figure 3:
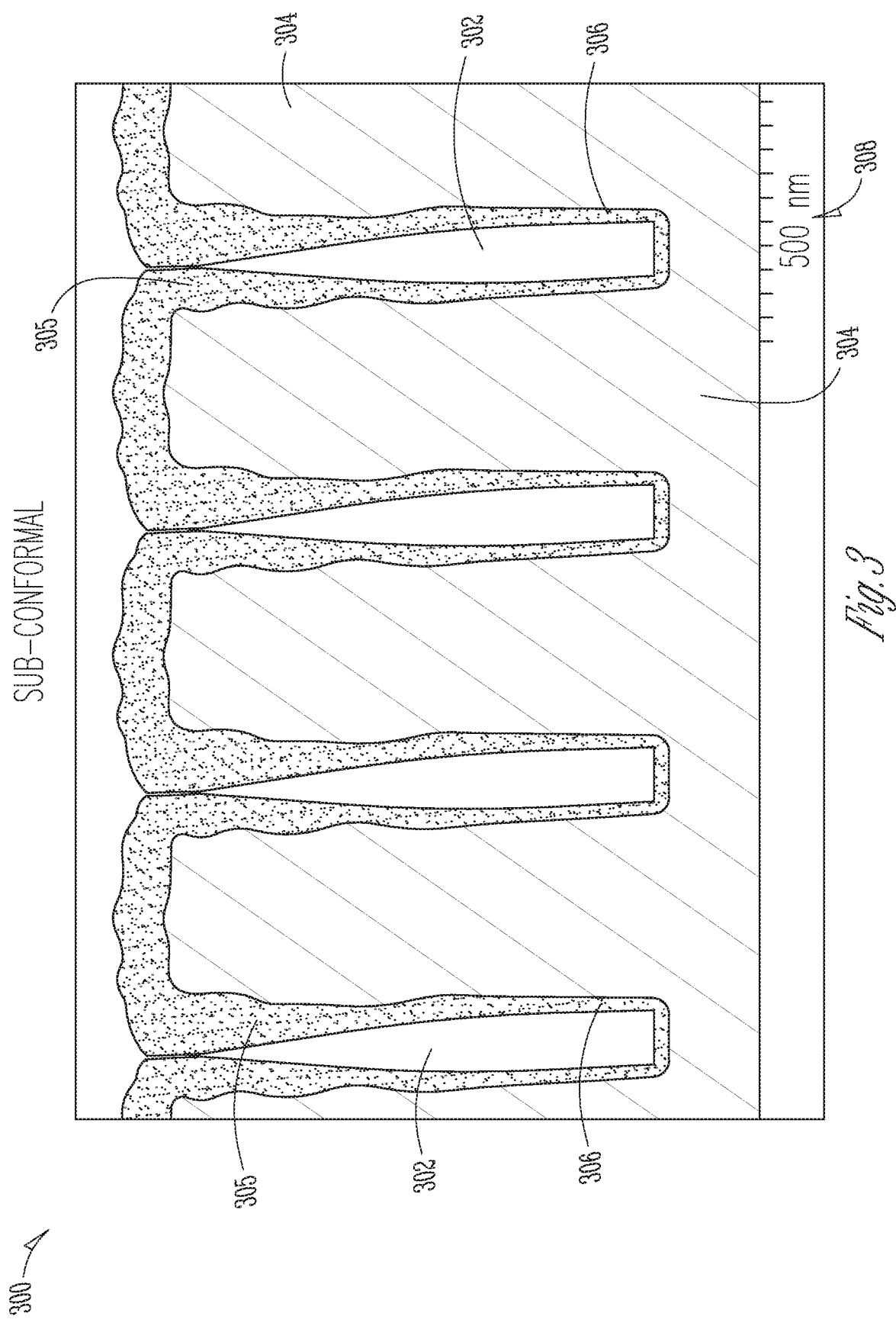
FIG. 3 includes schematic sectional views of a sub-conformal structure, according to an example embodiment.

A "sub-conformal" film on the other hand is thicker near the top of the feature than at the bottom. An example of a sub-conformal film 300 is shown in FIG. 3. High aspect trenches can be seen at 302 in an underlying structure 304. Upper portions 305 of the film 300 are thicker in cross section than lower portions 306 of the film 300 which are deeper in the trenches 302.

Figure 4:
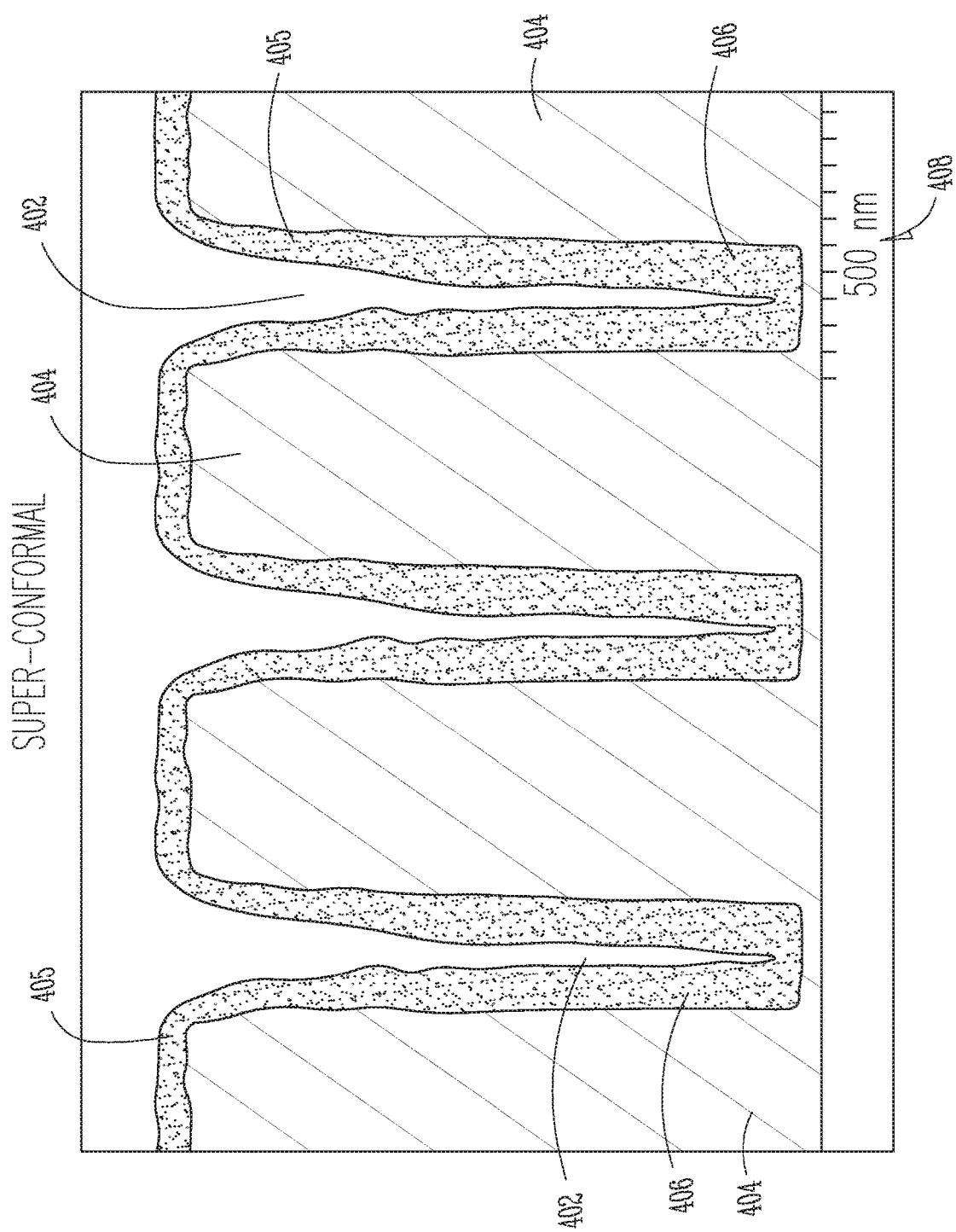
FIG. 4 includes schematic sectional views of a super-conformal structure, according to an example embodiment.

For certain semiconductor applications, a "super-conformal" film is desired. A super conformal film is thicker at the bottom of a feature than at the top. An example of a super-conformal film 400 is shown in FIG. 4. High aspect trenches are again visible at 402 in an underlying structure 404. Upper portions 405 of the film 400 are thinner in cross section than lower portions 406 of the film 400 which are deeper in the trenches 402. The nanometer size of the sub conformal and super conformal structures is given by the scaling 308 and 408 visible in the bottom right corner of each view.

Conventionally, super-conformality in a feature can be achieved by a controlled etch-back step which is performed in a separate module than the one used for the deposition process, or is achieved using a plasma step, both of which add complexity and cost to the process.

In the present disclosure, alternate profile control methods are provided. One example method includes in one aspect selectively inhibiting the top of a feature. This may be achieved in one example by utilizing a low exposure of an inhibiting precursor gas (also called an inhibitor herein) such that the precursor only adsorbs to the top of the feature. The inhibiting precursor gas can be delivered in the same chamber as the deposition precursors and requires little or no additional hardware or tool modification. Suitable inhibiting precursors for metal oxide deposition may include chelating agents, diketones such as acetylacetonate (HAcAc) for example, thiols such as butane thiol for example, alcohols such as ethanol for example, and phosphines. Other inhibiting precursors are possible.

Exposure of the inhibiting precursor can be expressed as a product of partial pressure and time. A reactive precursor such as trimethylaluminum will require an exposure of around $10^{-6}$ torr seconds to saturate a hydroxylated surface at 200 C. Thus, one example includes a 1 millisecond dose at a partial pressure of 1 mtorr, or a 10-millisecond dose at a partial pressure of 0.1 mtorr. A precursor with low reactivity such as dichlorosilane on an amine terminated surface will typically require an exposure of 1 torrsec at 400 C to saturate this surface.

In some examples, a low exposure of an inhibiting precursor gas may be defined as an exposure level <1% of the minimum exposure required to achieve saturation of a precursor gas on a flat surface. The table below includes approximate low exposure values in this regard.

| Film System | Minimum Exposure |
| --- | --- |
| AlMe3 + H2O → Al2O3 | $10^{-6}$ torr sec |
| Hf(NMe2)4 + H2O -> HfO2 | $10^{-5}$ torr sec |
| SiH2(Net2)2 + O2 plasma → SiO2 | $10^{-4}$ torr sec |
| SiH2Cl2 + NH3 plasma → SiN | $10^{-1}$ torr sec |

Improved film profile control can be provided using selective inhibition. For example, utilizing the affinity of chelating agents such as HAcAc to bind to and inhibit deposition on metal oxide surfaces, deposition of metal oxide films by ALD can be inhibited by exposing the substrate to the chelating agent in such a manner (for example, using low exposure of an inhibitor) so as to limit the binding to the field and top of the trench.

Methods of the present disclosure can for example be used in a remote plasma system or a capacitively coupled plasma system. A remote plasma system (also known as downstream plasma system or afterglow plasma system) is one in which the plasma and material (e.g. a semiconductor wafer) interaction occurs at a location remote from the plasma in the plasma afterglow.

Figure 7:
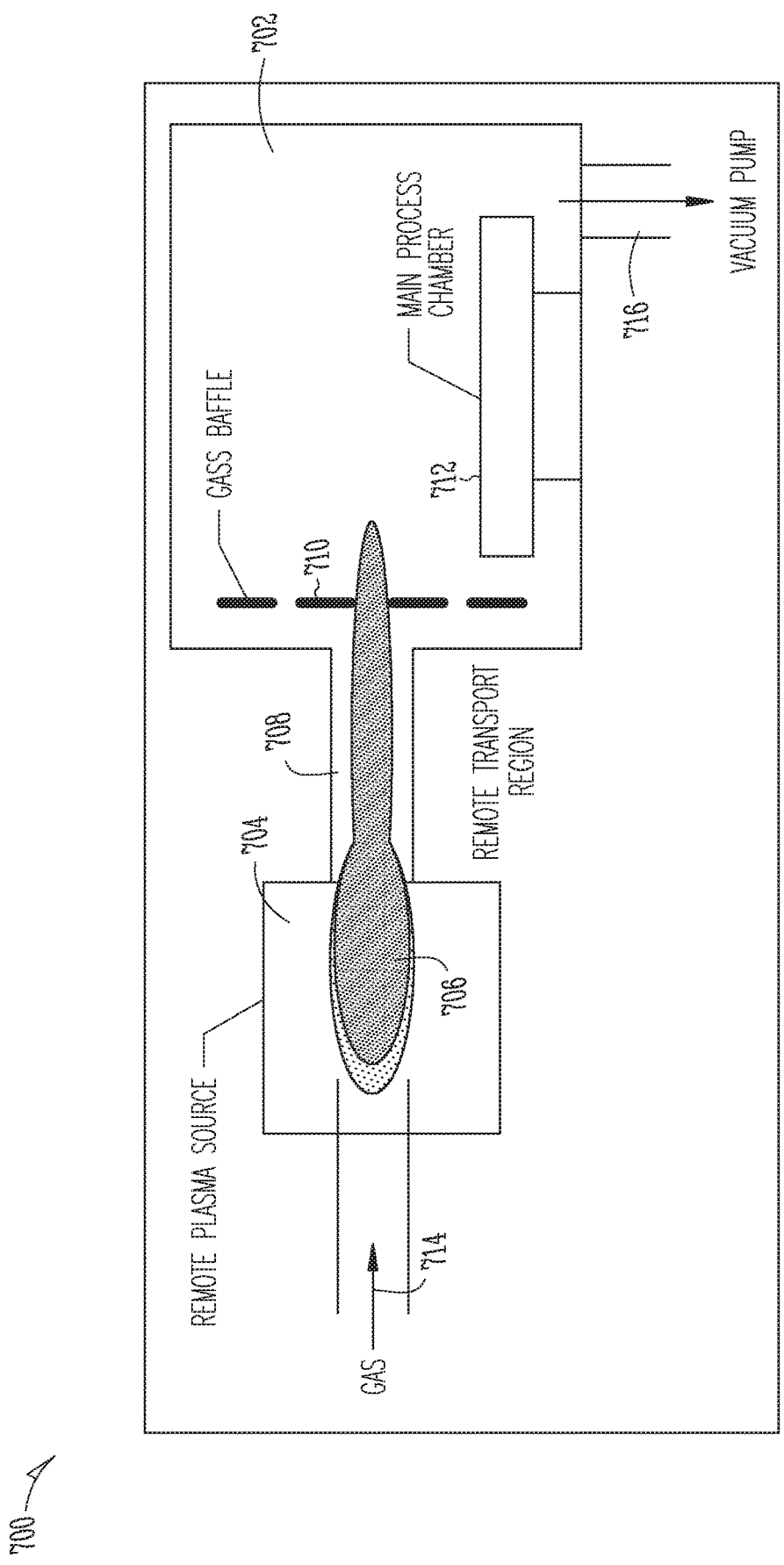
FIG. 7 is a schematic diagram of a remote plasma reactor, according to an example embodiment.

A schematic diagram of an example remote plasma system 700 is shown in FIG. 7. The system includes a main process chamber 702 and a remote plasma source 704. A gas source 714 and vacuum pump 716 are also included within the system 700. The plasma 706 passes through a remote transport region 708 and a gas baffle 710. Material interactions within the chamber occur at a location 712 in the plasma afterglow that is remote from or downstream of the plasma source 704.

Figure 5:
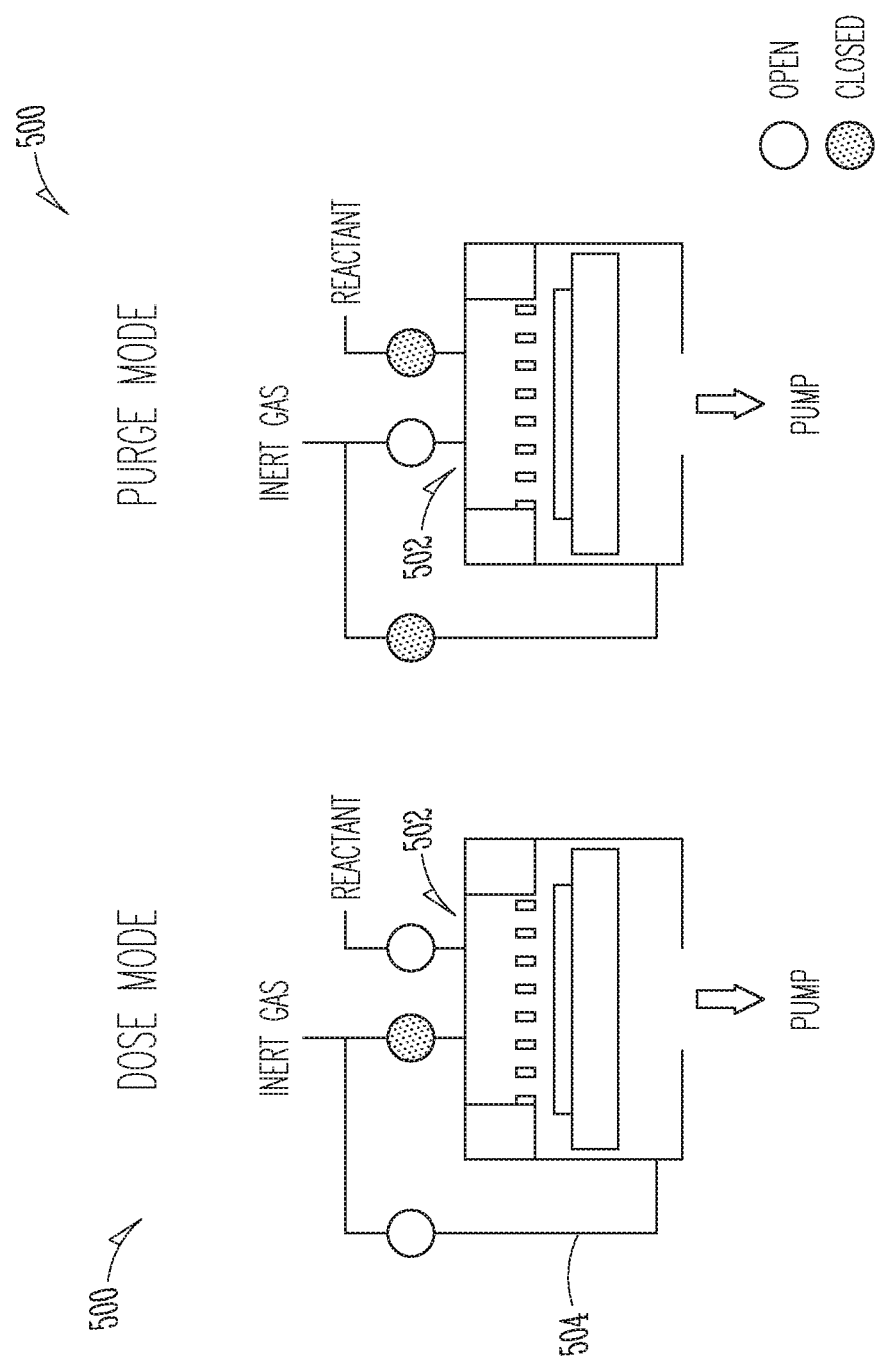
FIG. 5 is a schematic diagram of an SMFD reactor in respective dose and purge modes, according to an example embodiment.

Another example of a remote plasma system is shown in FIG. 5. Here, an ALD reactor for performing ALD with an inhibiting precursor is known as synchronously modulated flow and draw (SMFD). A schematic diagram of such an SMFD reactor 500 is shown in FIG. 5 in respective dose and purge modes. The SMFD reactor 500 injects inert flowing gas at the reactor inlet 502 during the purge mode and reactant enters the reactor at the inlet 502 in the dose mode.

Inert gas leaves the reactor 500 via the reactor outlet 504 during the dose mode. An inhibiting precursor may be injected into the reactor during either stage and the exposure controlled by adjust the volume and speed of exchanged gasses. The synchronized modulation of the inert or inhibiting flowing gas between the reactor inlet and the reactor outlet enables high-speed gas flow switching.

Methods of the present disclosure may also be employed in a number of other reactor configurations. For example, single-wafer ALD reactors for semiconductor processing may have different configurations for the gas flow. "Crossflow" reactors have parallel gas flows across the wafer surface. "Showerhead" reactors bring the gas into the reactor perpendicular to the wafer surface through a distributor plate. The gas then flows radially across the wafer surface. Other distinctions between ALD reactors may include hot and cold wall reactors. In "hot wall" reactors, the walls, gas, and substrates in the reactor are all heated to the temperature of the walls. In "cold wall" reactors, only the substrate is heated and the walls remain at room temperature or are only warmed slightly.

Other ALD reactors can deposit on many samples simultaneously. These reactors are known as "batch" reactors. They can coat multiple samples at the same time and can dramatically shorten the required time to coat one sample. The batch reactors can improve the cost and time effectiveness for commercial ALD processes. Reactant and purging time constants are longer in batch reactors because of larger reactor volumes and lower gas conductance between multiple samples. However, the multiplex advantage can offset the longer time constants.

Inductively coupled plasma (ICP) is a common plasma source during plasma ALD. Plasmas usually operate at pressures of ~100-500 mTorr. Plasma-enhanced ALD is not performed with an inert carrier gas during the plasma reaction cycle. However, the plasma reaction cycle may alternate with a conventional reactant ALD cycle using an inert carrier gas or inhibiting precursor of the present disclosure.

Figure 6:
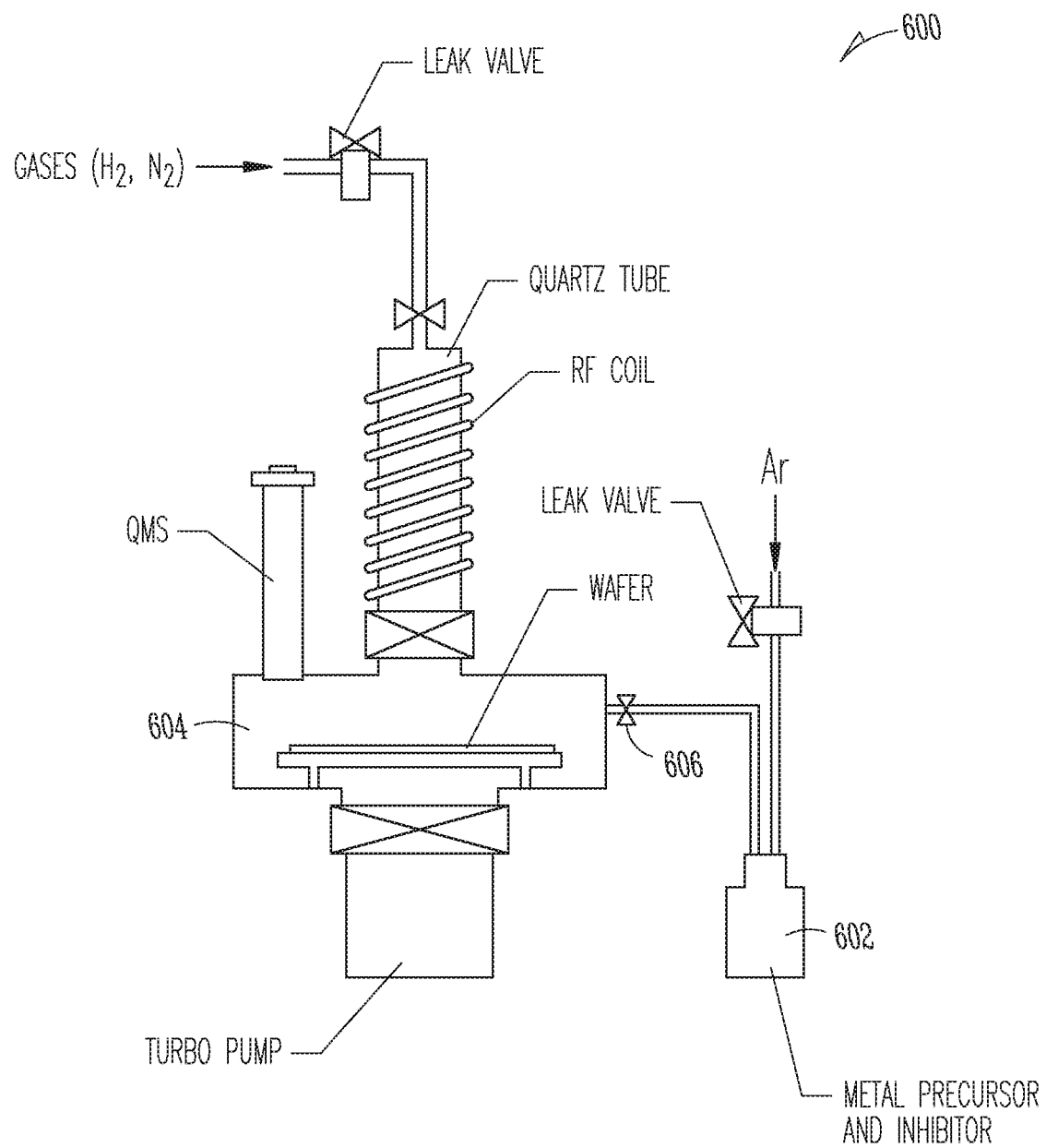
FIG. 6 is schematic diagram of an example ICP plasma ALD reactor, according to an example embodiment.

A schematic diagram of an example ICP plasma reactor 600 for performing certain disclosed embodiments is shown in FIG. 6. The reactor 600 includes component parts as shown and labelled in the view. These components include for example a gas source 601, a source of metal precursors and inhibitors 602, a first leak valve 603, a reactor chamber 604, a quartz tube 605, a control inlet valve 606, an RF coil 607, a second leak valve 608, a turbo pump 609 and a quadrupole mass spectrometry (QMS) module 610. An inhibiting precursor 602 can be selectively admitted to the reactor chamber 604 via the control inlet valve 606 in accordance with any one of the methods described herein.

The methods of the present disclosure may also be performed in a capacitively couple plasma (CCP) system. A typical CCP system is driven by a single radio-frequency (RF) power supply, typically at around 13.56 MHz. One of the two electrodes is connected to the power supply, and the other is grounded. As this configuration is similar in principle to a capacitor in an electric circuit, the plasma formed in this configuration is called a capacitively coupled plasma. Example CCP systems for performing the present methods may include single station modules or multi-station modules, also known as quad stations.

When an electric field is generated between electrodes, atoms are ionized and release electrons. The electrons in the gas are accelerated by the RF field and can ionize the gas directly or indirectly by collisions, producing secondary electrons. When the electric field is strong enough, it can lead to what is known as electron avalanche. After avalanche breakdown, the gas becomes electrically conductive due to abundant free electrons. Often it accompanies light emission from excited atoms or molecules in the gas.

Figure 8:
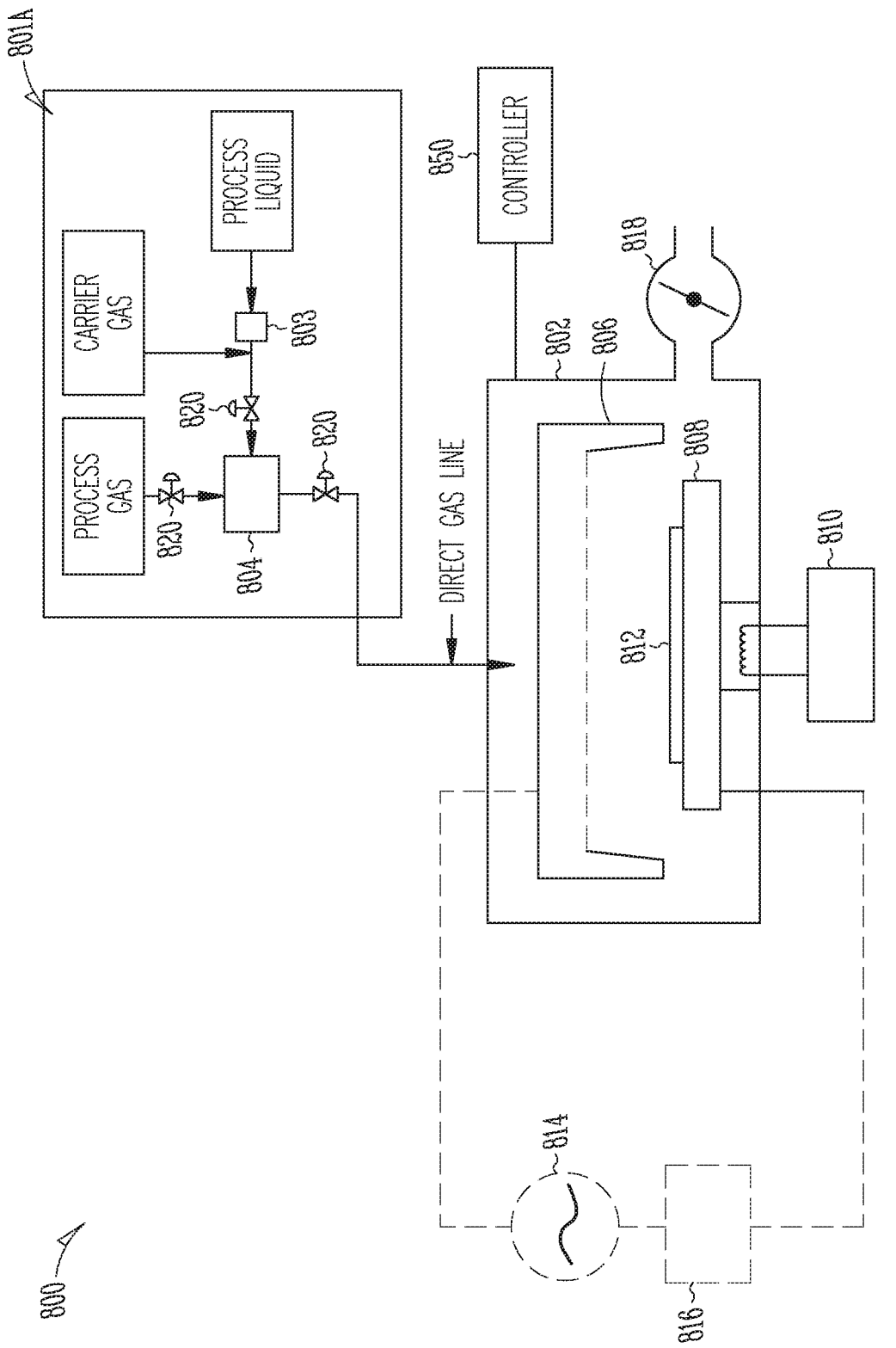
FIG. 8 is a schematic diagram of a CCP plasma reactor, according to an example embodiment.

A schematic diagram of an example CCP process reactor for performing certain disclosed embodiments is shown in FIG. 8. The view depicts a schematic illustration of an embodiment of an atomic layer deposition (ALD) process station 800 having a process chamber body 802 for maintaining a low-pressure environment. A plurality of ALD process stations 800 may be included in a common low-pressure process tool environment. In some embodiments, one or more hardware parameters of ALD process station 800 including those discussed in detail below may be adjusted programmatically by one or more computer controllers 850, also discussed further below.

The ALD process station 800 fluidly communicates with reactant delivery system 801a for delivering process gases to a distribution showerhead 806. The reactant delivery system 801a includes a mixing vessel 804 for blending and/or conditioning process gases, such as metal amide, metal alkoxide, or silicon amide gases, or an inhibiting precursor gas as defined above, for delivery to the showerhead 806. One or more mixing vessel inlet valves 820 may control introduction of process gases to a gas mixing vessel 804.

As an example, the embodiment of FIG. 8 includes a vaporization point 803 for vaporizing liquid reactant to be supplied to the mixing vessel 804. In some embodiments, the vaporization point 803 may be a heated vaporizer. The saturated reactant vapor produced from such vaporizers may condense in downstream delivery piping in some embodiments, delivery piping downstream of vaporization point 803 may be heat traced. In some examples, mixing vessel 704 may also be heat traced. In one non-limiting example, piping downstream of vaporization point 703 has an increasing temperature profile 25 extending from approximately 100° C. to approximately 150° C. at mixing vessel 704.

In some embodiments, a liquid precursor, or liquid inhibiting precursor, or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from the vaporization point 803. In one scenario, a liquid injector may be mounted directly to the mixing vessel 804. In another scenario, a liquid injector may be mounted directly to the showerhead 806.

The showerhead 806 distributes process gases toward substrate 812. In the embodiment shown in FIG. 8, the substrate 812 is located beneath the showerhead 806 and is shown resting on a pedestal 808. The showerhead 806 may have any suitable shape, and may have any suitable number and arrangement of ports for distributing process gases to substrate 812. In some embodiments, pedestal 808 may be raised or lowered to expose substrate (or wafer) 812 to a volume between the substrate 812 and the showerhead 806.

It will be appreciated that, in some embodiments, pedestal height may be adjusted programmatically by a suitable computer controller 850. In another scenario, adjusting a height of the pedestal 808 may allow a plasma density to be varied during plasma activation in the process in embodiments where a plasma is ignited. At the conclusion of the process phase, the pedestal 808 may be lowered during another substrate transfer phase to allow removal of substrate 812 from pedestal 808. In some embodiments, the pedestal 808 may be temperature controlled via heater 810. In some embodiments, the pedestal 808 may be heated to a temperature of between about 25° C. and about 400° C., or between about 200° C. and about 300° C., during selective deposition of films as described in disclosed embodiments. In some embodiments, the pedestal is set at a temperature between about 25° C. and about 400° C., or between about 200° C. and about 300° C.

Further, in some embodiments, pressure control for process station 800 may be provided by a butterfly valve 818. As shown in the embodiment of FIG. 8, the butterfly valve 818 throttles a vacuum provided by a downstream vacuum pump (not shown). However, in some embodiments, pressure control of process station 800 may also be adjusted by varying a flow rate of one or more gases introduced to the process station 800.

In some embodiments, a position of the showerhead 806 may be adjusted relative to the pedestal 808 to vary a volume between the substrate 812 and the showerhead 806. Further, it will be appreciated that a vertical position of pedestal 808 and/or showerhead 806 may be varied by any suitable mechanism within the scope of the present disclosure. In some embodiments, pedestal 808 may include a rotational axis for rotating an orientation of substrate 812. It will be appreciated that, in some embodiments, one or more of these example adjustments may be performed programmatically by one or more suitable computer controllers 850.

In some embodiments where plasma may be used as discussed above, the showerhead 806 and the pedestal 808 electrically communicate with a radio frequency (RF) power supply 814 and a matching network 816 for capacitively powering a plasma. In some embodiments, the plasma energy may be controlled by controlling one or more of a process station pressure, a gas concentration, an RF source power, an RF source frequency, and a plasma power pulse timing. For example, RF power supply 814 and the matching network 816 may be operated at any suitable power to form a plasma having a desired composition of radical species. The plasma power may be selected to be low to prevent sputtering of material on the surface of the substrate. Examples of suitable powers are about 150 W to about 6000 W.

The RF power supply 814 may provide RF power of any suitable frequency. The RF power supply 814 may be configured to control high- and low-frequency RF power sources independently of one another. Example low-frequency. RF frequencies may include, but are not limited to, frequencies between 0 kHz and 500 kHz. Example high-frequency RF frequencies may include, but are not limited to, frequencies between 1.8 MHz 25 and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

Figure 9:
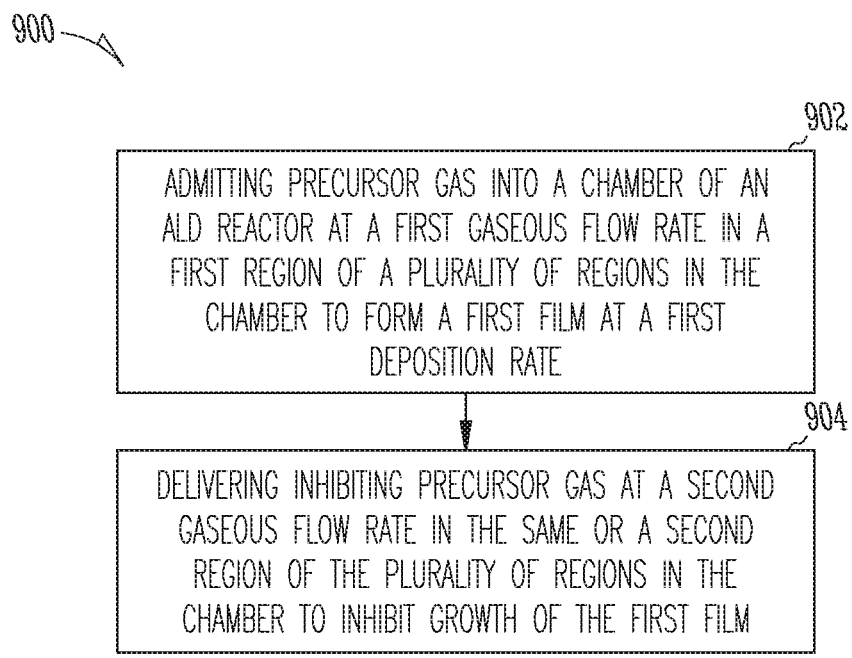
FIG. 9 is flow chart showing operations in a method, according to an example embodiment.

The present disclosure also includes example methods. In one example, with reference to FIG. 9, a method 900 for profile control in metal oxide deposition comprises, at 902, admitting precursor gas into a chamber of an ALD reactor at a first gaseous flow rate in a first region of a plurality of regions in the chamber to form a first film at a first deposition rate; and, at 904, delivering inhibiting precursor gas at a second gaseous flow rate in the same or a second region of the plurality of regions in the chamber to inhibit growth of the first film.

Figure 10:
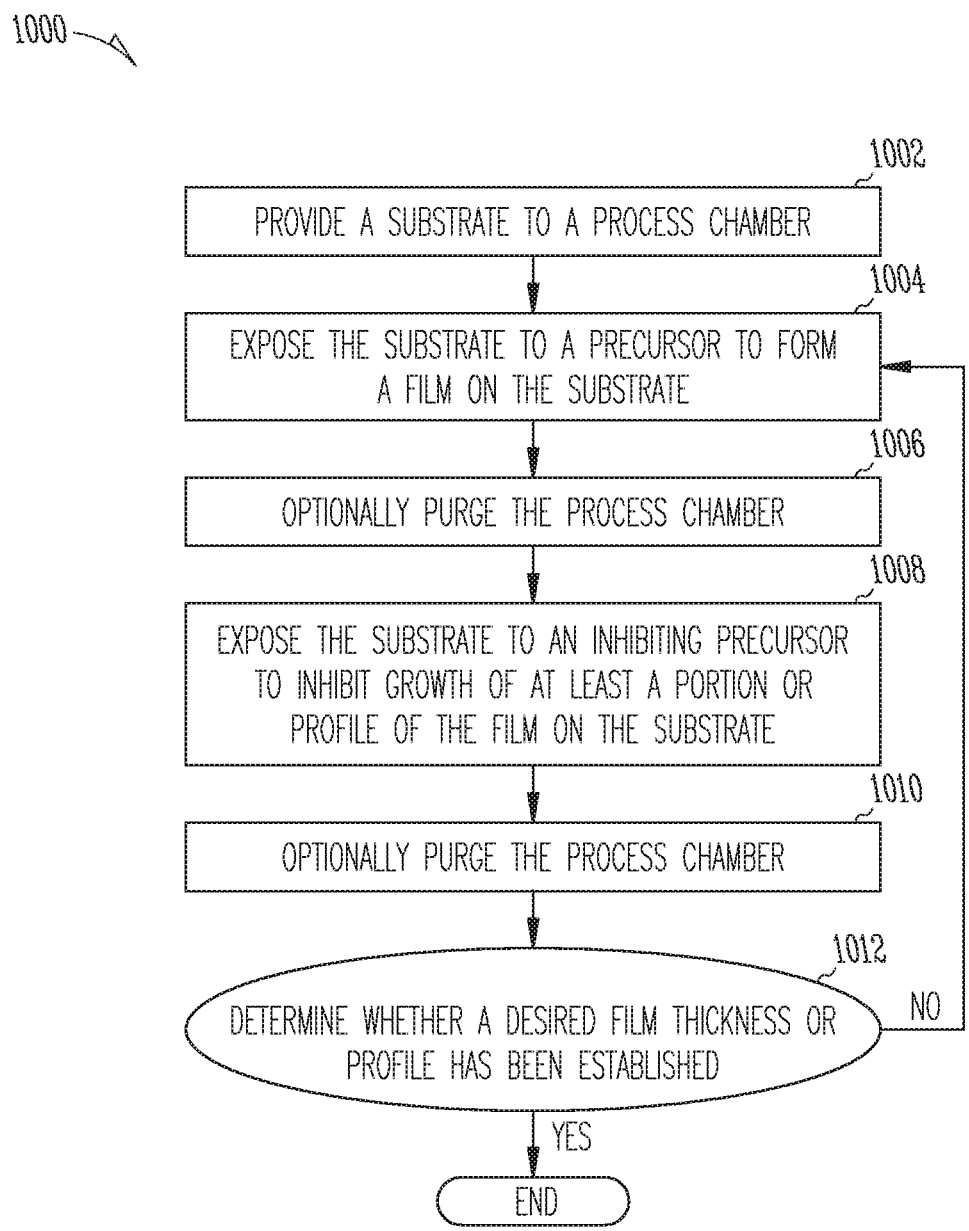
FIG. 10 is flow chart showing operations in a method, according to an example embodiment.

With reference to FIG. 10, an example method 1000 for profile control in metal oxide deposition comprises, at 1002, providing a substrate to a process chamber; at 1004, exposing the substrate to a precursor to form a film on the substrate; at 1006, optionally purging the process chamber; at 1008, exposing the substrate to an inhibiting precursor to inhibit growth of at least a portion or profile of the film on the substrate; at 1010, optionally purging the process chamber; at 1012, determining whether a desired film thickness or profile has been established. If not, operations 1004-1012 are repeated in sufficient cycles until a film of desired thickness or profile is formed. In some embodiments, the operations are performed in different order, for example the substrate may be exposed to an inhibiting precursor before being exposed to the precursor.

In some examples, a non-transitory machine-readable medium 1122 includes instructions that, when read by a machine (for example a computer controller 1100), cause the machine to perform operations comprising at least the non-limiting example operations summarized above.

Figure 11:
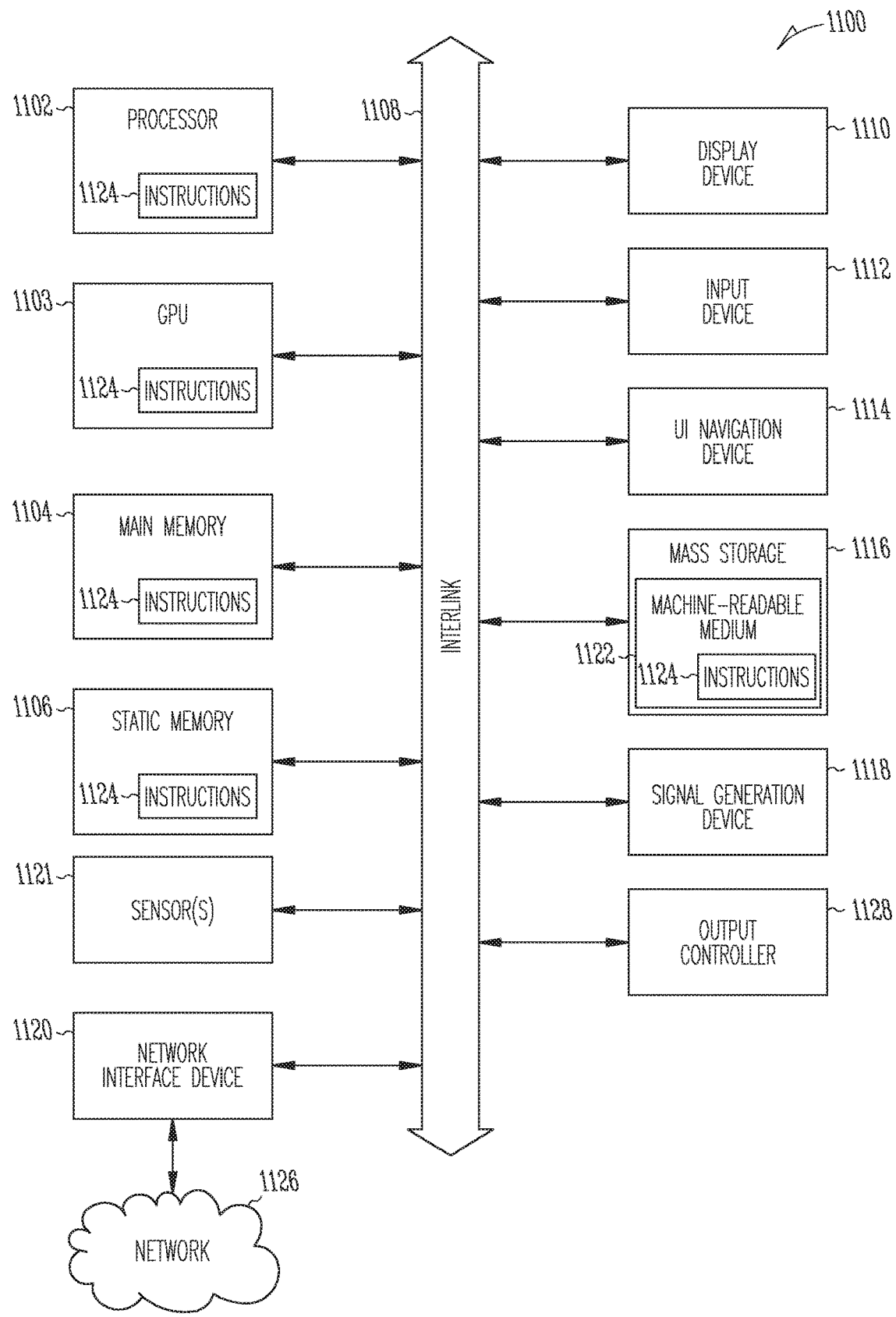
FIG. 11 is a block diagram illustrating an example of a computer controller by which one or more example methods herein may be controlled.

FIG. 11 is a block diagram illustrating an example of a computer controller 1100 upon which one or more example process embodiments described herein may be implemented, or by which one or more example process embodiments described herein may be controlled. In alternative embodiments, the machine 1100 may operate as a stand-alone device or may be connected (e.g., networked) to other machines. In a networked deployment, the computer controller 1100 may operate in the capacity of a server machine, a client machine, or both in server-client network environments. In an example, the computer controller 1100 may act as a peer machine in a peer-to-peer (P2P) (or other distributed) network environment. Further, while only a single computer controller 1100 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuitry of a first circuitry at one point in time and reused by a second circuit in the first circuitry, or by a third circuit in a second circuitry, at a different time.

The computer controller (e.g., computer system) 1100 may include a hardware processor 1102 (e.g., a central processing unit (CPU), a hardware processor core, or any combination thereof), a graphics processing unit (GPU) 1103, a main memory 1104, and a static memory 1106, some or all of which may communicate with each other via an interlink (e.g., bus) 1108. The computer controller 1100 may further include a display device 1110, an alphanumeric input device 1112 (e.g., a keyboard), and a user interface (UI) navigation device 1114 (e.g., a mouse). In an example, the display device 1110, alphanumeric input device 1112, and UI navigation device 1114 may be a touch screen display. The computer controller 1100 may additionally include a mass storage device (e.g., drive unit) 1116, a signal generation device 1118 (e.g., a speaker), a network interface device 1120, and one or more sensors 1121, such as a Global Positioning System (GPS) sensor, compass, accelerometer, or another sensor. The computer controller 1100 may include an output controller 1128, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 1116 may include a machine-readable medium 1122 on which is stored one or more sets of data structures or instructions 1124 (e.g., software) embodying or utilized by any one or more of the techniques or functions described herein. The instructions 1124 may also reside, completely or at least partially, within the main memory 1104, within the static memory 1106, within the hardware processor 1102, or within the GPU 1103 during execution thereof by the computer controller 1100. In an example, one or any combination of the hardware processor 1102, the CPU 1103, the main memory 1104, the static memory 1106, or the mass storage device 1116 may constitute machine-readable media.

While the machine-readable medium 1122 is illustrated as a single medium, the term "machine-readable medium" may include a single medium, or multiple media, (e.g., a centralized or distributed database, and/or associated caches and servers) configured to store the one or more instructions 1124.

The term "machine-readable medium" may include any medium that is capable of storing, encoding, or carrying instructions 1124 for execution by the computer controller 1100 and that cause the computer controller 1100 to perform any one or more of the techniques of the present disclosure, or that is capable of storing, encoding, or carrying data structures used by or associated with such instructions 1124. Non-limiting machine-readable medium examples may include solid-state memories; and optical and magnetic media. In an example, a massed machine-readable medium comprises a machine-readable medium 1122 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks. The instructions 1124 may further be transmitted or received over a communications network 1126 using a transmission medium via the network interface device 1120.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method for profile control in atomic level deposition (ALD), the method comprising:
   admitting precursor gas into a chamber of an ALD reactor at a first gaseous flow rate in a first region of a plurality of regions in the chamber to form a first film at a first deposition rate; and
   delivering inhibiting precursor gas at a second gaseous flow rate in the same or a second region of the plurality of regions in the chamber to inhibit growth of the first film, the inhibiting precursor gas delivered at an exposure level <1% of a minimum exposure required to achieve saturation of the precursor gas on a flat surface.

2. The method of claim 1, further comprising deliver the inhibiting precursor gas into the chamber prior to admission of the precursor gas into the chamber.

3. The method of claim 1, further comprising delivering the precursor gas into the chamber prior to admission of the inhibiting precursor gas into the chamber.

4. The method of claim 1, further comprising delivering the inhibiting precursor gas into the chamber simultaneously with admission of the precursor gas into the chamber.

5. The method of claim 1, further comprising delivering a second precursor gas at a third gaseous flow rate in one of the plurality of regions to form a second film at a second deposition rate in the chamber.

6. The method of claim 5, further comprising delivering the second precursor gas simultaneously with admission of the inhibiting precursor gas into the chamber.

7. The method of claim 1, further comprising including a chelating agent in the precursor gas.

8. The method of claim 7, further comprising including in the chelating agent one or more of HAcAc, butane thiol, ethanol, and phosphine.

* * * * *